United States Patent

Mountsier

Patent Number: 6,054,206
Date of Patent: Apr. 25, 2000

[54] CHEMICAL VAPOR DEPOSITION OF LOW DENSITY SILICON DIOXIDE FILMS

[75] Inventor: Thomas Weller Mountsier, San Jose, Calif.

[73] Assignee: Novellus Systems, Inc., San Jose, Calif.

[21] Appl. No.: 09/102,969

[22] Filed: Jun. 22, 1998

[51] Int. Cl.$^7$ ....................................................... B05D 3/06
[52] U.S. Cl. ..................................... 428/312.8; 428/319.1; 427/573; 427/574; 427/579; 427/237; 427/238; 427/255.3; 427/294; 427/314
[58] Field of Search ................................ 428/312.8, 319.1

[56] References Cited

U.S. PATENT DOCUMENTS

| | | | |
|---|---|---|---|
| 4,872,947 | 10/1989 | Wang et al. | 156/643 |
| 4,987,102 | 1/1991 | Nguyen et al. | 437/238 |
| 5,354,611 | 10/1994 | Arthur et al. | 428/325 |
| 5,360,646 | 11/1994 | Morita | 427/574 |
| 5,362,526 | 11/1994 | Wang et al. | 427/573 |
| 5,426,076 | 6/1995 | Moghadam | 437/238 |
| 5,470,802 | 11/1995 | Gnade et al. | 437/238 |
| 5,569,058 | 10/1996 | Gnade et al. | 445/24 |
| 5,686,031 | 11/1997 | Coronado et al. | 264/40.1 |
| 5,840,631 | 11/1998 | Kubo et al. | 438/789 |

OTHER PUBLICATIONS

D. Bulla, et al., "Method to obtain TEOS PECVD Silicon Oxide Thick Layers for Optoelectronics devices Application", Laboratério de Sistemas Integráveis da EPUSP, 4 pages, (no date cited).

T. Ramos, et al., "Nanoporous Silica for Low K Dielectrics", Mat. Res. Symp. Proc., vol. 443, pp. 91–98 (1997).

M. Jo, et al., "Evaluation of $SiO_2$ aerogel thin film with ultra low dielectric constant as an intermetal dielectric", Microelectronic Engineering 33, pp. 343–348 (1997).

L. Hrubesh, "Silica Aerogel: An Intrinsically Low Dielectric Constant Material", Mat. Res. Soc. Symp. Proc., vol. 381, pp. 267–272 (1995).

P. Brüsch, et al., "Electrical and Infrared Dielectrical Properties of Silica Aerogels and of Silica–Aerogel–Based Composites", Appl. Phys. A 57, pp. 329–337 (Jun. 1993).

*Primary Examiner*—Ellen M. McAvoy
*Attorney, Agent, or Firm*—Skjerven, Morrill, MacPherson, Franklin & Friel LLP; Roberta P. Saxon

[57] ABSTRACT

A process for producing low-density, porous silica films in a vacuum environment is provided. The films are advantageous for use as low dielectric constant insulating materials in semiconductor devices. In a first step, an organic-group-containing silica precursor is deposited on a semiconductor substrate in a chemical vapor deposition reactor. In a second step, the organic groups are removed by heating in a furnace in an oxidizing environment or by exposure to an oxidizing plasma, thereby creating a low density silica film.

9 Claims, No Drawings

CHEMICAL VAPOR DEPOSITION OF LOW DENSITY SILICON DIOXIDE FILMS

BACKGROUND OF THE INVENTION

1. Field of the Invention

The present invention relates generally to processes for making low density, porous silicon dioxide films and more particularly relates to processes for making porous silica films for use as an insulating material for integrated circuits.

2. Description of Related Art

Advanced integrated circuits for semiconductor devices having higher performance and greater functionality are often characterized by decreasing device feature geometries. As device geometries become smaller, the dielectric constant of an insulating material used between conducting paths becomes an increasingly important factor in device performance. Reducing this value advantageously lowers power consumption, reduces crosstalk, and shortens signal delay for closely spaced conductors.

Silicon oxide ($SiO_2$) has long been used in integrated circuits as the primary insulating material. With a dielectric constant of approximately 4, $SiO_2$ has the lowest dielectric constant of all inorganic materials. One option for achieving a dielectric material with a lower dielectric constant is to use organic or polymeric materials However, these materials tend to have limited thermal and mechanical stability.

Another approach is to use porous, low density materials in which a significant fraction of the bulk volume contains air, which has a dielectric constant of approximately 1. The properties of porous materials are proportional to their porosity. For example, at a porosity of about 80%, the dielectric constant of a porous silica film, i.e. porous $SiO_2$, is approximately 1.5. The potential utility of porous silica, particularly silica aerogels, as a low dielectric constant insulating material has been recognized. (See, for example, L. Hrubesh, Mat. Res. Soc. Symp. Proc. Vol. 381, p. 267 (1995) and M. Jo et al., Microelectronic Engineering, Vol. 33, p. 343 (1997).)

Aerogels are sol-gel derived solids consisting of molecular sized clusters which themselves have microporosity, and which are connected in such a way that a three dimensional structure forms without having pores larger than a few cluster diameters. The rigid skeleton occupies only a very small fraction of the total volume. A typical sol-gel process for applying a silica aerogel thin film on a semiconductor substrate is described, for example, in U.S. Pat. No. 5,569,058, "LOW DENSITY, HIGH POROSITY MATERIAL AS GATE DIELECTRIC FOR FIELD EMISSION DEVICE." A precursor solution of tetraethylorthosilicate (TEOS), ethanol, water, and small amounts of HCl and $NH_4OH$ is applied to the substrate surface. The precursor solution is gelled on the surface, a process which takes up to 12 hours, and aged in a saturated ethanol atmosphere for approximately 24 hours at 37° C. To prevent premature drying, the surface is immersed in liquid or in a saturated atmosphere at all times prior to the drying stage. Deposition of the precursor solution on silicon substrates using conventional spinning and dipping methods of semiconductor fabrication are described, for example by Hrubesh and references therein. The methods are performed in enclosures maintained with a saturated alcohol atmosphere.

The next step in the sol-gel process is to dry the alcohol-filled gel without collapsing the structure or inducing shrinkage and densification. A typical method of drying uses supercritical extraction. Unfortunately, supercritical drying requires high pressure and is therefore difficult to accomplish in a high-production environment. Also, supercritically-dried aerogel tends to be hydrophilic. Alternative methods involving additional steps of solvent exchange and surface modification and drying at sub-critical or supercritical pressures are described in U.S. Pat. No. 5,470,802, "METHOD OF MAKING A SEMICONDUCTOR DEVICE USING A LOW DIELECTRIC CONSTANT MATERIAL." Aerogels produced by sol-gel processes typically have pore diameters less than 50 nm.

While thin film silica aerogels for use as dielectric layers have been prepared by sol-gel techniques, these techniques are not well adapted for high-throughput semiconductor processing environments. The sol-gel process is a wet chemistry process, requiring long processing times, saturated alcohol atmospheres, and, in many applications, high pressure for supercritical solvent extraction. There are problems associated with the wet chemistry sol-gel process of controlling particulate contamination and of controlling pore size and film shrinkage on drying. Thus, it would be desirable to provide a method of producing a low dielectric constant low density, porous silica film in a dry, vacuum environment that avoids the wet chemistry processing steps of the sol-gel technique. It would be desirable if the method avoids the problem of film shrinkage and if the porous silica film produced is more hydrophobic than sol-gel produced silica aerogel films.

SUMMARY OF THE INVENTION

The present invention is directed to a process for producing low density, porous silica films in a vacuum environment by a chemical vapor deposition (CVD) process. According to the present invention, in a first step, an organic-containing silica precursor is deposited on a semiconductor substrate using a conventional CVD process. For example, an organosilicate, such as tetraethylorthosilicate, or an organosilane is used as the silica precursor. Deposition is performed in an environment with low oxidant content. The low oxidant environment has insufficient oxidant for complete oxidation of the precursor, resulting in a film including some of the original organic content. The CVD process is optionally plasma enhanced. In a second step, the deposited film is treated to remove essentially all of the organic groups, leaving a low-density, porous silica film. The organic groups are removed, for example, by heating in a furnace in an oxidizing environment or by exposure to an oxidizing plasma. The CVD process described above provides porous silica films with advantageously small pore sizes. Residual organic fragments in the film advantageously promote hydrophobicity of the porous silica films produced by the CVD process.

DETAILED DESCRIPTION

According to the present invention, a two-step process for depositing low density, porous silica films for use as dielectric layers in semiconductor devices is provided.

In the first step, a film of an organic-containing silica precursor is deposited on a substrate in a CVD reactor. An organosilicate compound, for example, tetraethylorthosilicate (TEOS) or tetramethylorthosilicate (TMOS), or an organosilane, such as, tetramethylsilane or a phenylsilane, is advantageously used as the silica precursor. The organic groups on the organosilicate or organosilane precursors can be aromatic or aliphatic. Alternatively, mixtures of the aforementioned compounds, or mixed compounds, in which some organic substituents are bonded to silicon through an oxygen linkage and others are attached directly to silicon, such as alkylalkoxysilanes, are used as silica precursors. Deposition is performed in an environment with low oxidant content such that the resulting film has a high organic, i.e. carbon-containing content. By controlling the deposition environment, the organic groups of the silica precursor are not oxidized during deposition. For example, deposition is performed in a nitrogen or inert gas environment. The total gas pressure in the CVD reactor chamber is typically between 10 mTorr and 10 Torr. The substrate temperature is typically in the range from about 200° C. to 450° C. Optionally, the CVD process is plasma enhanced. In plasma enhanced CVD, a radio frequency discharge is applied to the reactants in the reactor chamber.

In the second step of producing a porous silica film according to the present invention, the film deposited in the first step is treated to remove essentially all of the organic groups. The film remaining after treatment is the low-density silica film. In one process, the organic groups are removed by heating in a furnace in an oxidizing environment at temperatures, for example, between 300° C. and 450° C. In another process, the organic groups are removed by exposing the film to an oxidizing plasma. For example, when TEOS is used as the silica precursor, treatment of the second step removes the ethyl groups. When an organosilane is used as the silica precursor, providing additional oxygen in the second step results in a substitution reaction, replacing the organic groups bonded to the silicon with oxygen. The pore sizes of the CVD-produced porous silica film are typically on the order of the size of the departing organic groups, i.e. less than 2 nm. In contrast, the pore size of sol-gel produced silica aerogels is characterized by the size of liquid bubbles removed in the drying process. The lower limit for pore size of silica aerogels is typically 10 to 20 nm.

The porous silica films produced by the CVD process of the present invention, are advantageously used as insulating materials in advanced semiconductor devices. The CVD-produced porous silica films avoid difficulties associated with the use of sol-gel produced silica aerogels as insulating materials. The small pore sizes, of the CVD porous films, typically less than 2 nm, are smaller than the feature sizes of the next generation of integrated circuit devices, while aerogel pore sizes may be on the same order as device feature sizes. In addition, the small pores of the CVD porous film are less likely to link together during processing to form large vacancies than is experienced in the case of silica aerogels.

Furthermore, avoidance of a solvent drying step in the CVD process for producing porous films advantageously avoids the problem of film shrinkage on drying encountered in the sol-gel process. Elimination of shrinkage is essential for film use in integrated circuits to avoid problems of mechanical cracks and voids and incomplete filling of gaps between adjacent conductors. In addition, films produced by the process of the present invention include residual organic fragments. Residual organic fragments in the film advantageously promote hydrophobicity of the CVD porous silica films.

While the foregoing discussion has been directed to deposition of porous silica films by chemical vapor deposition of organic-containing silica precursors, it will be understood that the process can also provide porous films of other inorganic oxides from suitable organic-containing precursors. For example, low density, porous films of aluminum oxide with advantageously low dielectric constants are provided by this process. The present invention is defined by the following claims.

We claim:

1. A process of forming a low-density, porous silica film on a semiconductor substrate comprising:

providing a semiconductor substrate in a chemical vapor deposition reactor;

providing a silica precursor gas in the reactor, wherein the silica precursor gas contains organic groups;

depositing a film of the silica precursor on the substrate in an environment with low oxidant content; and removing essentially all of the organic groups from the deposited silica precursor film.

2. The process of claim 1 wherein the silica precursor comprises one or more members selected from the group consisting of organosilicates, organosilanes, and alkylalkoxysilanes.

3. The process of claim 1 wherein the silica precursor is selected from the group consisting of tetraethylorthosilicate and tetramethylorthosilicate.

4. The process of claim 1 wherein removing the organic groups is by heating in an oxidizing environment.

5. The process of claim 1 wherein removing the organic groups is by exposure to an oxidizing plasma.

6. The process of claim 1 wherein depositing a film of the silica precursor is depositing a film of the silica precursor at a reactor pressure between 100 mTorr and 10 Torr.

7. The process of claim 1 wherein depositing a film of the silica precursor is depositing a film of the silica precursor at a temperature between 200° C. and 450° C.

8. The process of claim 1 further comprising providing a radio frequency discharge in the reactor during deposition.

9. A porous silica film on a semiconductor substrate produced by the process of claim 1.

* * * * *